United States Patent [19]
Wu

[11] Patent Number: 6,046,080
[45] Date of Patent: Apr. 4, 2000

[54] METHOD OF MAKING A LOAD RESISTOR OF A STATIC RANDOM ACCESS MEMORY ON A SEMICONDUCTOR WAFER

[75] Inventor: Yi-Tyng Wu, Chiayi, Taiwan

[73] Assignee: United Microelectronics Corp., Hsin-Chu, Taiwan

[21] Appl. No.: 09/264,014

[22] Filed: Feb. 8, 1999

[51] Int. Cl.[7] ............................................. H01L 21/8234
[52] U.S. Cl. ..................... 438/238; 438/381; 438/382; 438/786
[58] Field of Search .................................. 438/238, 381, 438/382, 383, 622, 786

[56] References Cited

U.S. PATENT DOCUMENTS 5,330,930  7/1994  Chi .
5,365,104  11/1994  Godinho et al. ..................... 257/529
5,877,059  3/1999  Harward ............................. 438/381

*Primary Examiner*—Trung Dang
*Attorney, Agent, or Firm*—Winston Hsu

[57] ABSTRACT

The present invention relates to a method of making a load resistor of a static random access memory on a dielectric layer of a semiconductor wafer. This method comprises depositing a poly-silicon layer on the dielectric layer, depositing a silicon-oxy-nitride ($SiO_xN_Y$) layer on the poly-silicon layer, performing a photolithographic process to define an area for making the load resistor, and performing an etching process to remove the silicon-oxy-nitride layer and the poly-silicon layer in all areas except for the area of the load resistor so as to form the load resistor. The poly-silicon layer of the load resistor is used as a conductive resistance layer, and the silicon-oxy-nitride layer of the load resistor is used as a radiation insulating layer for preventing radiation damages of the load resistor caused by plasma radiation in plasma processes to be performed later on.

3 Claims, 3 Drawing Sheets

6,046,080

METHOD OF MAKING A LOAD RESISTOR OF A STATIC RANDOM ACCESS MEMORY ON A SEMICONDUCTOR WAFER

BACKGROUND OF THE INVENTION

1. Field of the Invention

The present invention relates to a semiconductor process, and more particularly, to a method of forming a load resistor of a static random access memory on the surface of a dielectric layer of a semiconductor wafer.

2. Description of the Prior Art

In a semiconductor process, polysilicon is often positioned to function as resistors. These resistors can be used in place of load transistors. When load transistors of a static random access memory (SRAM) is replaced by polysilicon, the number of transistors in the SRAM can be reduced and thus saves cost and enhance the integration of the SRAM.

Please refer to FIG. 1. FIG. 1 is a cross-sectional view of a prior art semiconductor wafer 10. The semiconductor wafer 10 comprises a silicon substrate 12, a metal-oxide-semiconductor (MOS) transistor 14 formed on the silicon substrate 12, an inter-poly dielectric (IPD) layer 16 deposited on the silicon substrate 12, a conductive resistance layer 18 deposited on the IPD layer 16, a contact hole 24 positioned in the IPD layer 16 for electrically connecting the MOS transistor 14 and the conductive resistance layer 18, a silicon nitride (SiN) layer 20 deposited on the IPD layer 16 and the conductive resistance layer 18, and an inter-layer dielectric (ILD) layer 22 deposited on the surface of the silicon nitride layer 20. The conductive resistance layer 18 is a linearly arranged poly-silicon layer. The IPD layer 16 is formed by neutral silicate glass for isolating poly-silicon layers. The ILD layer 22 is formed by borophosphosilicate glass (BPSG) for isolating the poly-silicon layers and metallic layers positioned on the ILD layer 22.

Please refer to FIG. 2. FIG. 2 is a cross-sectional view of the semiconductor wafer 10 when contact holes 26, 28 are formed. The contact holes 26, 28 are formed above the MOS transistor 14 and the conductive resistance layer 18, respectively. The contact hole 28 is formed through the ILD layer 22 and provides an opening through which the conductive resistance layer 18 may be connected to connections and components overlying the ILD layer 22. Likewise, the contact hole 26 is formed through both the ILD layer 22 and the IPD layer 16 and similarly provides an opening through which the MOS transistor 14 may be connected to overlying components.

The ILD layer 22 is formed by performing a high-density plasma-enhanced chemical vapor deposition (HDP CVD) process. The HDP CVD is performed by using a low energy ionic plasma source with a dosage of $10^{12}$ cm$^{-2}$. The plasma source with such a dosage commonly causes plasma damages by accumulating an excess amount of electrons and positive charges on the surface of the conductive resistance layer 18, and radiation damages by radiating plasma onto the conductive resistance layer 18. Both plasma and radiation damages will result in instability of the conductive resistance layer 18, destruction of the structure of the MOS transistor 14, and thus a reduced breakdown voltage of the MOS transistor 14. However, the formation of the silicon nitride layer 20 on the surface of the conductive resistance layer 18 can serve as an anti-radiation layer to prevent the above mentioned problems from occurring.

Nevertheless, etching the contact hole 26 above the MOS transistor 14 through the silicon nitride layer 20 may deform the profile of the contact hole 26. The contact hole 26 is formed by performing a dry etching process followed by a wet etching process. The wet etching process is performed by using hydrofluoric acid (HF) to clean off polymers left behind on the surface of the contact hole 26. However, the hydrofluoric acid etches silicon dioxide ($SiO_2$) more readily than it does silicon nitride (SiN). This difference results in the silicon nitride 20 protruding from the sidewall of the IPD layer 16 and the ILD layer 22 (as seen in FIG. 2) thus creating an uneven profile of the contact hole 26.

SUMMARY OF THE INVENTION

It is therefore a primary objective of the present invention to provide a method of making a load resistor of an SRAM on a semiconductor wafer to solve the above mentioned problem.

In a preferred embodiment, the present invention relates to a method of making a load resistor of a static random access memory on a dielectric layer of a semiconductor wafer comprising:

depositing a poly-silicon layer on the dielectric layer;

depositing a silicon-oxy-nitride ($SiO_xN_y$) layer on the poly-silicon layer;

performing a photolithographic process to define an area for making the load resistor; and performing an etching process to remove the silicon-oxy-nitride layer and the poly-silicon layer in all areas except for the area of the load resistor so as to form the load resistor;

wherein the poly-silicon layer of the load resistor is used as a conductive resistance layer, and the silicon-oxy-nitride layer of the load resistor is used as a radiation insulating layer for preventing radiation damages of the load resistor caused by plasma radiation in plasma processes to be performed later on.

It is an advantage of the present invention that the silicon-oxy-nitride layer of the load resistor does not extend to a contact hole to be formed later on so that the profile of the contact hole can be formed nicely and the yield of the semiconductor wafer can be improved.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
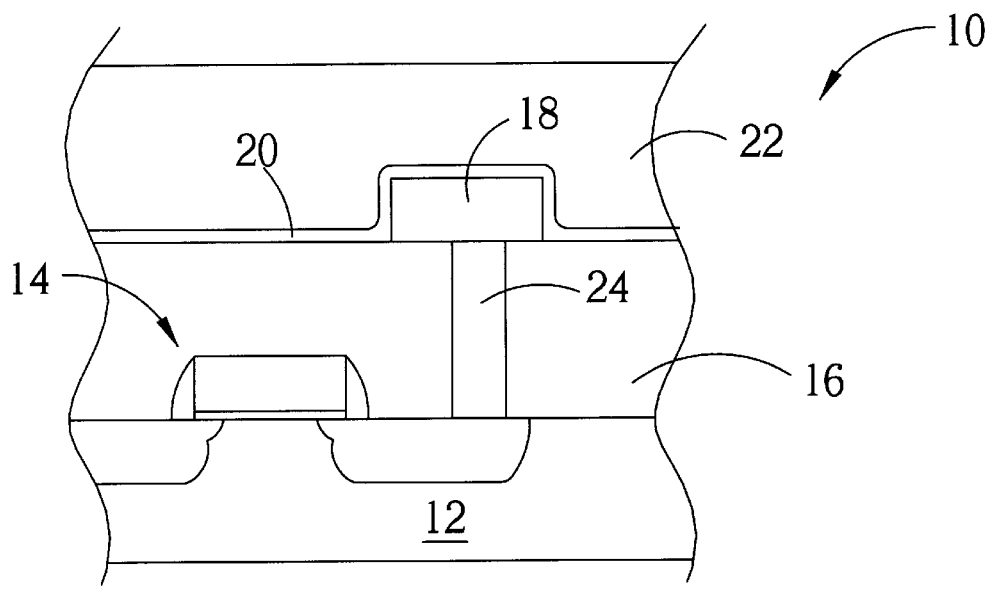
FIG. 1 is a cross-sectional view of a prior art semiconductor wafer.
Figure 2:
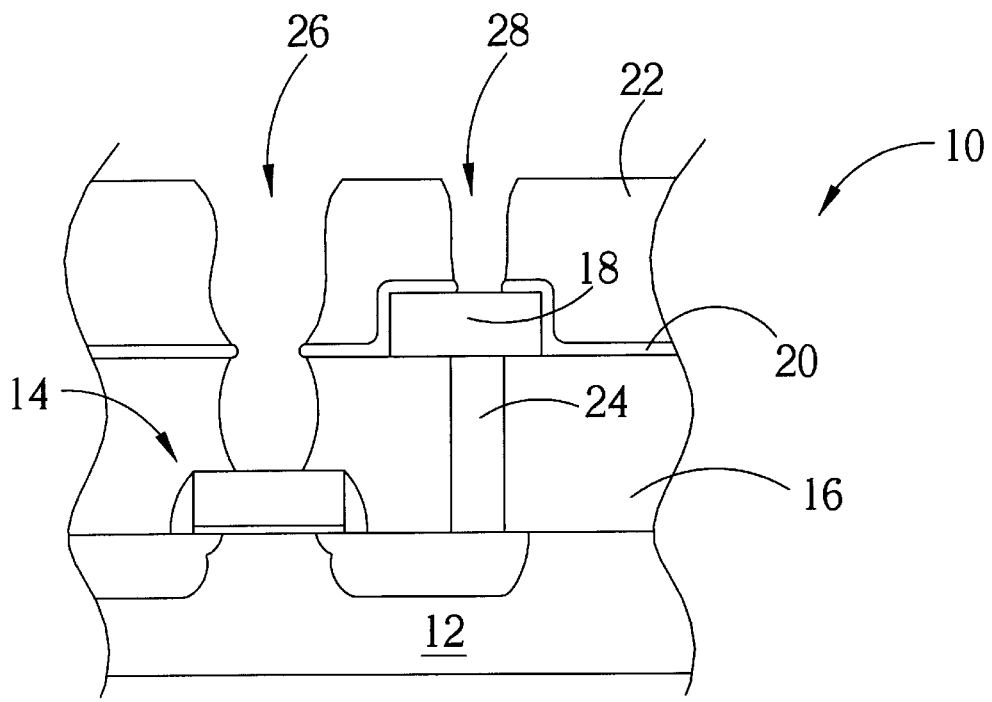
FIG. 2 is a cross-sectional view of the semiconductor wafer in FIG. 1 with contact holes.
Figure 3:
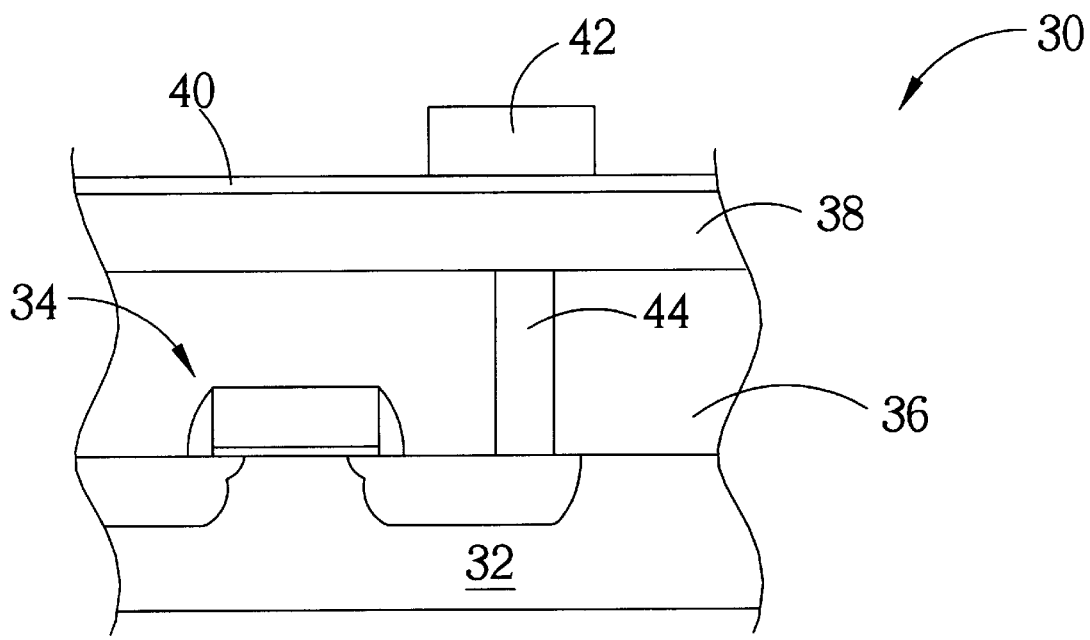
FIG. 3 is a cross-sectional view of a semiconductor wafer according to the present invention.

Please refer to FIG. 3. FIG. 3 is a cross-sectional view of a semiconductor wafer 30 according to the present invention. The semiconductor wafer 30 comprises a silicon substrate 32, a MOS transistor 34 formed on the silicon substrate 32, an IPD layer 36 formed of neutral silicate glass deposited on the silicon substrate 32, a contact hole 44 positioned in the IPD layer 36, a polysilicon layer 38 deposited on the IPD layer 36, and a silicon-oxy-nitride ($SiO_xN_y$) layer 40 deposited on the polysilicon layer 38.

Figure 4:
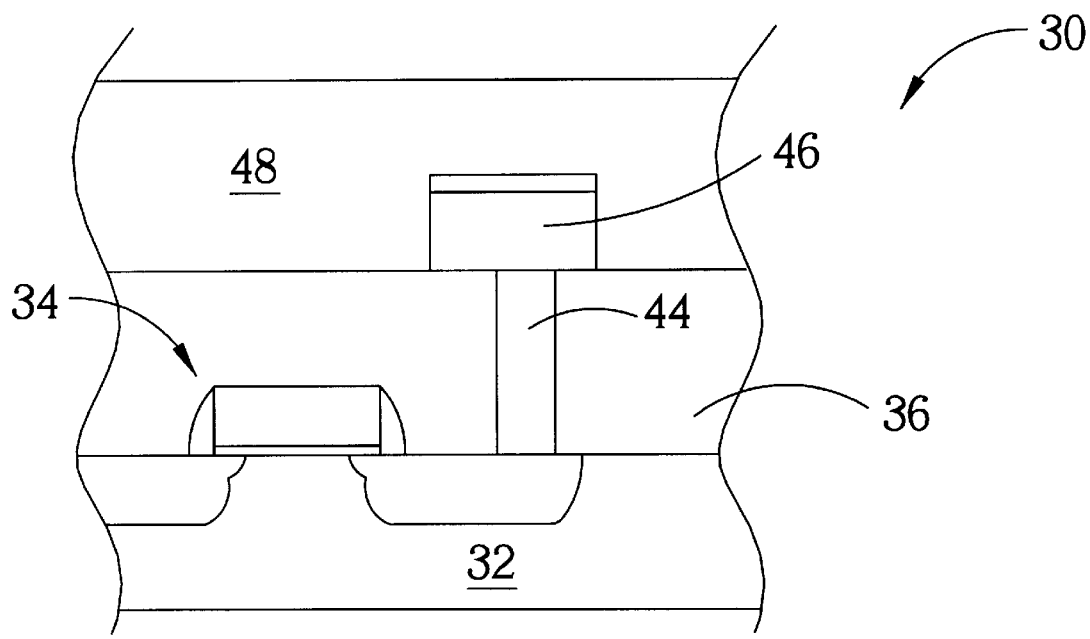
FIG. 4 is a cross-sectional view of the semiconductor wafer in FIG. 3 with a load resistor of an SRAM.
Figure 5:
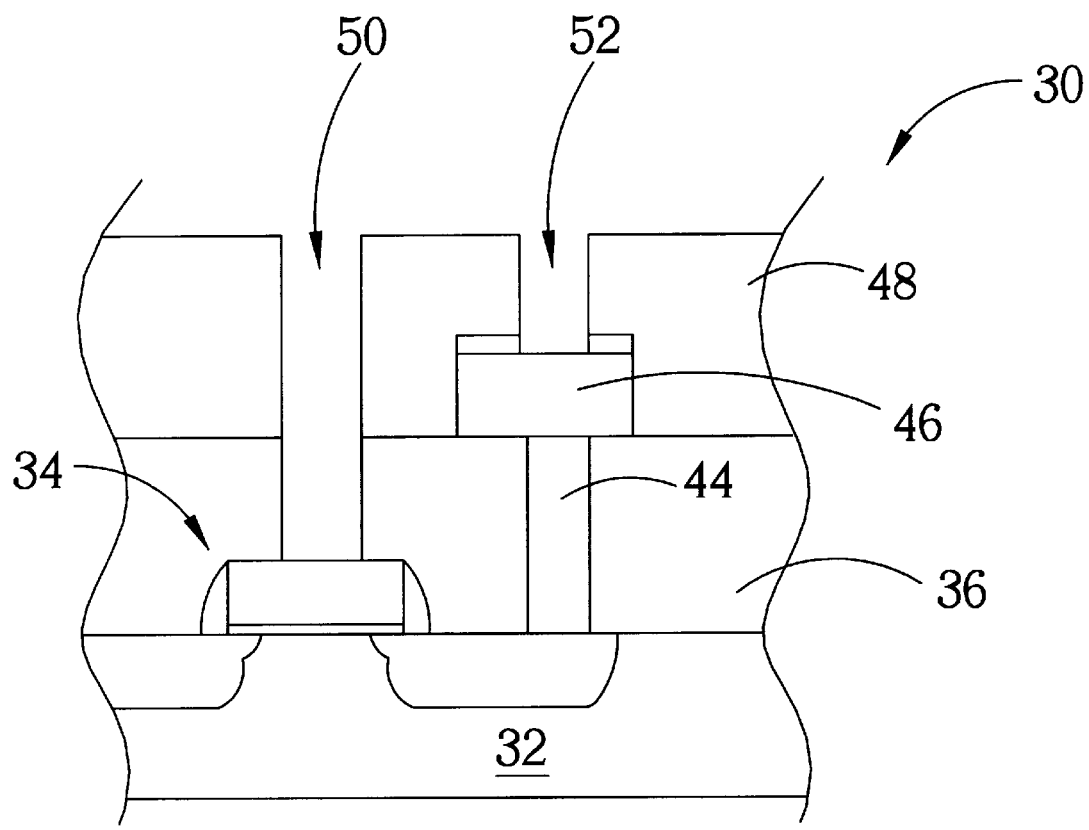
FIG. 5 is a cross-sectional view of the semiconductor wafer in FIG. 3 with contact holes.

Please refer to FIG. 4. FIG. 4 is a cross-sectional view of the semiconductor wafer 30 with a load resistor 46 of an SRAM. After forming the silicon-oxy-nitride layer 40, the position and size of a load resistor 46 of an SRAM is defined on the semiconductor wafer 30 by forming a photo-resist layer 42 through performing a photolithographic process. And an etching process is performed to remove unwanted portions of the polysilicon layer 38 and the silicon-oxy-nitride layer 40 to form the load resistor 46 of the SRAM. Afterward, an ILD layer 48 formed of BPSG is deposited onto the surface of the semiconductor wafer 30 by performing an HDP CVD process. The ILD layer 48 functions as a dielectric layer that isolates the polysilicon layer 38 from metallic layers that will be deposited later on. Please refer to FIG. 5. FIG. 5 is a cross-sectional view of the semiconductor wafer 30 with contact holes 50, 52. The contact hole 50 is positioned on the MOS transistor 34 penetrating through the ILD layer 48 and the IPD layer 36. The contact hole 52 is positioned on the load resistor 46 penetrating through the ILD layer 48. The contact holes 50 and 52 are formed by performing photolithographic and etching processes to allow electrical connections between the MOS transistor 34 and the load resistor 46 with overlying components respectively.

In the formation of the load resistor 46, the silicon-oxy-nitride layer 40 of the load resistor 46 is used as a radiation insulating layer to prevent radiation damages of the load resistor 46 caused by plasma radiation in the subsequent HDP CVD process. Furthermore, the silicon-oxy-nitride 40 only forms on top of the load resistor 46 and therefore will not damage the profile of contact hole 50 when forming the contact hole 50. Moreover, the refractive index of the silicon-oxy-nitride layer 40 is approximately 1.75, thus it can be used as an anti-reflective layer during the photolithographic process, and the need of depositing a bottom anti-reflective layer can be obviated.

In contrast to the prior art method, the method of forming the load resistor 46 of the SRAM utilizes the silicon-oxy-nitride layer 40 as both an anti-reflective layer and a radiation insulating layer. This silicon-oxy-nitride layer 40 can prevent radiation damages of the load resistor 46, and it does not extend to the contact hole 50 thus provides an effective and optimal means of etching the contact hole 50 and improves the yield of the semiconductor wafer 30.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of making a load resistor of a static random access memory on a dielectric layer of a semiconductor wafer comprising:

depositing a poly-silicon layer on the dielectric layer;

depositing a silicon-oxy-nitride ($SiO_xN_y$) layer on the poly-silicon layer;

performing a photolithographic process to define an area for making the load resistor; and performing an etching process to remove the silicon-oxy-nitride layer and the poly-silicon layer in all areas except for the area of the load resistor so as to form the load resistor;

wherein the poly-silicon layer of the load resistor is used as a conductive resistance layer, and the silicon-oxy-nitride layer of the load resistor is used as a radiation insulating layer for preventing radiation damages of the load resistor caused by plasma radiation in plasma processes to be performed later on.

2. The method of claim 1 wherein the dielectric layer is formed by borophosphosilicate glass and is used as an inter-poly dieletric (IPD) layer positioned under the poly-silicon layer.

3. The method of claim 1 wherein the silicon-oxy-nitride layer is an anti-reflective layer for reducing reflective light generated during the photolithography process.

* * * * *